(12) United States Patent
Freidl et al.

(10) Patent No.: US 12,446,199 B2
(45) Date of Patent: Oct. 14, 2025

(54) ON-CHIP SHIELDED DEVICE

(71) Applicant: NXP B.V., Eindhoven (NL)

(72) Inventors: Philipp Franz Freidl, Weurt (NL); Mustafa Acar, Eindhoven (NL); Antonius Hendrikus Jozef Kamphuis, Nijmegen (NL); Erik Daniel Björk, Sollentuna (SE); Konstantinos Giannakidis, Eindhoven (NL); Jan Willem Bergman, Veghel (NL); Rajesh Mandamparambil, Eindhoven (NL); Paul Mattheijssen, Boxtel (NL)

(73) Assignee: NXP B.V., Eindhoven (NL)

( * ) Notice: Subject to any disclaimer, the term of this patent is extended or adjusted under 35 U.S.C. 154(b) by 222 days.

(21) Appl. No.: 18/048,495

(22) Filed: Oct. 21, 2022

(65) Prior Publication Data

US 2024/0138129 A1 Apr. 25, 2024
US 2024/0237316 A9 Jul. 11, 2024

(51) Int. Cl.
*H05K 9/00* (2006.01)
*H01L 23/552* (2006.01)

(52) U.S. Cl.
CPC ......... *H05K 9/0032* (2013.01); *H01L 23/552* (2013.01); *H05K 9/0088* (2013.01)

(58) Field of Classification Search
CPC .. H05K 9/0032; H05K 9/0088; H01L 23/552; H01L 23/66; H01L 23/5225

USPC ......................................................... 361/181
See application file for complete search history.

(56) References Cited

U.S. PATENT DOCUMENTS

| 8,729,679 | B1 | 5/2014 | Phua | |
|---|---|---|---|---|
| 10,037,951 | B2 | 7/2018 | Shen et al. | |
| 2009/0212401 | A1* | 8/2009 | Do | H01L 24/73 257/659 |
| 2012/0280366 | A1* | 11/2012 | Kamgaing | H01L 23/552 257/E23.114 |
| 2016/0035680 | A1 | 2/2016 | Wu | |
| 2018/0240757 | A1* | 8/2018 | Wong | H01L 23/552 |
| 2020/0176393 | A1 | 6/2020 | Ketterson | |
| 2020/0321288 | A1 | 10/2020 | Huang et al. | |
| 2021/0384159 | A1* | 12/2021 | Ko | H01L 25/18 |
| 2022/0028798 | A1* | 1/2022 | Sirinorakul | H01L 23/49503 |
| 2023/0275034 | A1* | 8/2023 | Lee | H01L 23/552 257/659 |
| 2023/0420382 | A1* | 12/2023 | Kim | H01L 25/165 |

FOREIGN PATENT DOCUMENTS

EP 2741326 A2 11/2014
KR 20070037826 A 4/2007

* cited by examiner

*Primary Examiner* — Sreeya Sreevatsa

(57) ABSTRACT

One example discloses an on-chip shielded device, including: a planar structure including a substrate and a passivation layer; an electrical component formed within the substrate and coupled to an input signal path and an output signal path; a first shielding element positioned above the electrical component and the passivation layer; and a second shielding element positioned above the electrical component, the passivation layer and the first shielding element.

24 Claims, 4 Drawing Sheets

ON-CHIP SHIELDED DEVICE

The present specification relates to systems, methods, apparatuses, devices, articles of manufacture and instructions for device shielding.

SUMMARY

According to an example embodiment, an on-chip shielded device, comprising: a planar structure including a substrate and a passivation layer; an electrical component formed within the substrate and coupled to an input signal path and an output signal path; a first shielding element positioned above the electrical component and the passivation layer; and a second shielding element positioned above the electrical component, the passivation layer and the first shielding element.

In another example embodiment, the electrical component is in contact with the first shielding element.

In another example embodiment, the electrical component is separated from the first shielding element by the passivation layer.

In another example embodiment, the first shielding element is an organic core and/or photoresist-like material.

In another example embodiment, the first shielding element is ferromagnetic, non-conductive, and/or has a high dielectric constant.

In another example embodiment, the first shielding element is configured to provide electromagnetic shielding between the electrical component and a set of additional electrical components on the substrate.

In another example embodiment, the second shielding element is a metal.

In another example embodiment, the second shielding element is positioned around all sides of the first shielding element other than a side of the first shielding element facing the passivation layer.

In another example embodiment, the first shielding element and the second shielding element are configured to block electromagnetic energy from reaching the electrical component.

In another example embodiment, further comprising a metallization layer positioned above the diffusion layer and below the passivation layer.

In another example embodiment, the metallization layer includes a reference plane.

In another example embodiment, the electrical component is coupled to the reference plane.

In another example embodiment, the passivation layer includes a set of vias; and the vias couple the reference plane to the first shielding element.

In another example embodiment, the passivation layer includes a set of vias; and the vias couple the reference plane to the second shielding element.

In another example embodiment, the passivation layer includes a set of vias; the vias couple the reference plane to either or both the first shielding element and the second shielding element; and the vias are arranged as a via-fence surrounding the electrical component.

In another example embodiment, the passivation layer includes a set of vias; the set of vias couple both the first shielding element and the second shielding element to the reference plane; and the electrical component is coupled to the reference plane.

In another example embodiment, further comprising an encapsulation layer; and wherein the encapsulation layer covers the first and second shielding elements.

In another example embodiment, the electrical component is a first electrical component; further comprising a second electrical component, formed within the substrate and the diffusion layer; and wherein the first and second electrical components are separated by a distance.

In another example embodiment, further comprising, a third shielding element positioned above the second electrical component; and a fourth shielding element positioned above the second electrical component and the third shielding element; wherein the first and second shielding elements are separated from the third and fourth shielding elements by the distance.

In another example embodiment, further comprising an encapsulation layer; and wherein the encapsulation layer covers the first, second, third and fourth shielding elements.

In another example embodiment, the input signal path and the output signal path are configured to connect with a set of nodes outside of the first and second shielding elements.

In another example embodiment, the electrical component is an active component.

In another example embodiment, the electrical component is a passive component.

In another example embodiment, the electrical component is at least one of: a monolithic microwave integrated circuits (MMICs), a waveguide, an RF device, an RF tuner, an RF amplifier, an RF detector, or an RF antenna.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings.

Figure 1:
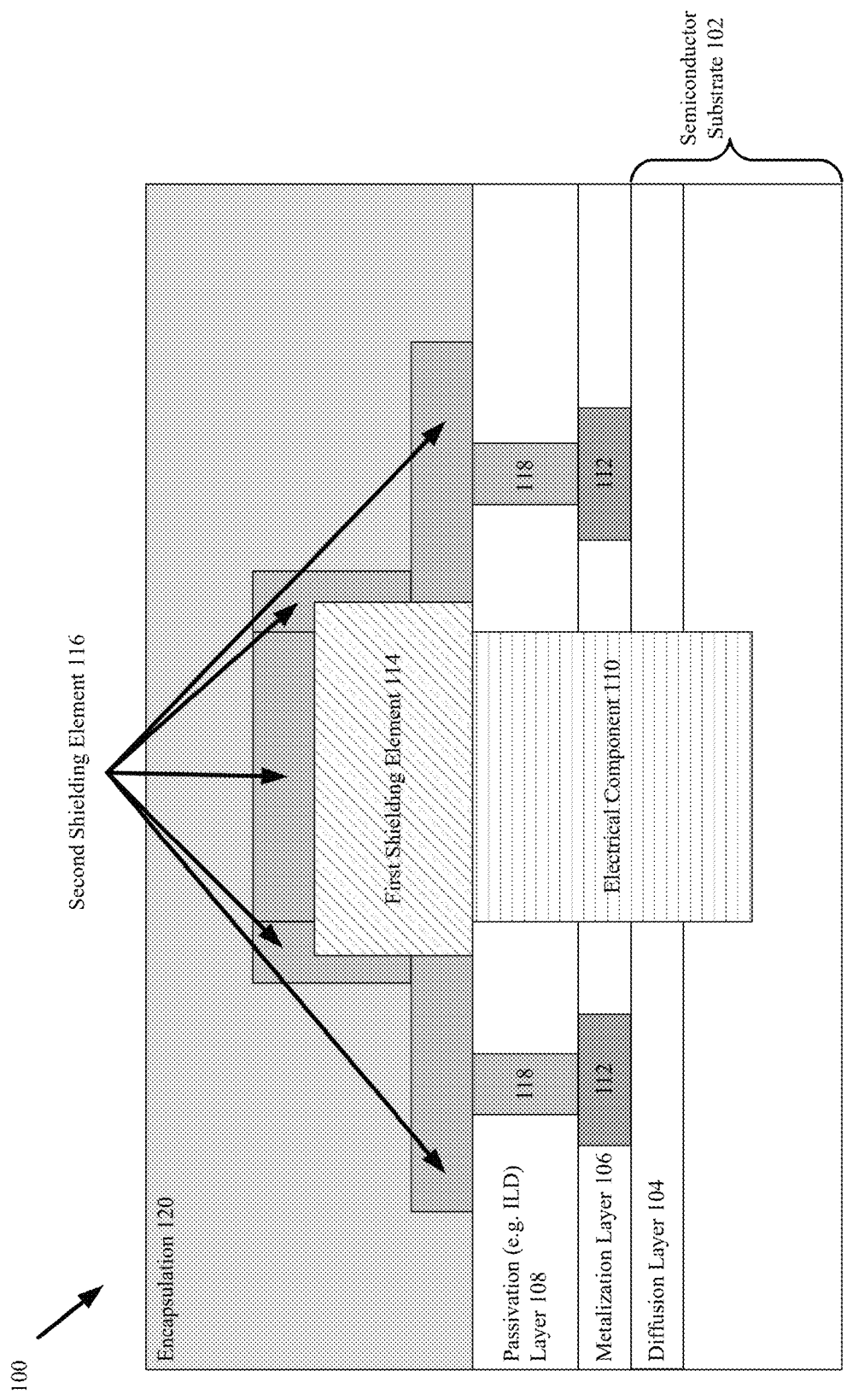
FIG. 1 represents a first example of an on-chip shielded device.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Some electronic components within an integrated circuit (IC) (i.e. semiconductor or insulator substrate based devices typically formed on a wafer, diced into chips, and packaged/encapsulated) are more sensitive to electromagnetic (EM) radiation interference than others, including applications through 20 GHz.

For example, monolithic microwave integrated circuits (MMICs) are a type of integrated circuit (IC) device that operate at microwave frequencies (300 MHz to 500 GHz, 5G, 6G, radar, etc.). MMICs are used for microwave mixing, power amplification, low-noise amplification, and high-frequency switching and are very sensitive to EM radiation.

Such EM radiation can originate outside of an IC package from ambient or other nearby devices, or from inside the IC package from cross-talk received from other electrical components (e.g. from surface waves from power amplifier entering the material to patch antennas), antennas, mixers, filters, and the like within the IC package.

Some approaches to reducing such EM interference include: on-chip or off-chip added inductors, capacitors, whole IC package shielding, coaxial transmission lines, couplers, and TSV (Through Silicon Via) fences.

Now discussed is a shielding structure built on a surface of a die (e.g. wafer, on-chip, integrated circuit (IC)) having a set of electrical components using a first shielding element (e.g. thick organic/dielectric feature) and a second shielding element (e.g. metal plated over the first shielding element) to provide a desired level of electromagnetic (EM) (e.g. cross-talk) isolation from both external (i.e. ambient, off-chip) and internal (i.e. on-chip) electromagnetic interference. In some example embodiments one or more on-chip electrical components are individually shielded at the die level during wafer fabrication.

FIG. 1 represents a first example 100 of an on-chip shielded device 100. The first example shielded device 100 includes a substrate 102 (e.g. insulator, semiconductor, wafer, chip, etc.), an optional diffusion layer 104, a metal layer 106, a passivation layer 108 (e.g. SiO2, ILD (Isolation Layer Dielectric), etc.), an electrical component 110 (e.g. active, passive, EM sensitive, etc.), a reference plane 112 (e.g. ground plane), a first shielding element 114 (e.g. ferromagnetic, dielectric, non-conductive, and/or organic material), a second shielding element 116 (e.g. conformal metal plating), a set of vias 118, and an encapsulation 120 (e.g. molding compound) for packaging the on-chip shielded device 100.

The substrate 102 can be a planar structure (e.g. wafer-like) and may formed of a semiconductor or an insulator.

The electrical component 110 is formed within the substrate 102 and coupled to an input signal path and an output signal path. In some example embodiments, the electrical component 110 is an active component (e.g. transistor, MOSFET, bipolar, amplifier, etc.). In other example embodiments, the electrical component 110 is a passive component (e.g. capacitor, inductor, resistor, etc.). In many example embodiments, the electrical component 110 is an active and/or passive electromagnetically sensitive component (e.g. monolithic microwave integrated circuits (MMICs), waveguide, RF device, tuner, amplifier, detector, antenna, etc.).

The first shielding element 114 positioned above the electrical component 110 and the passivation layer 108. In some example embodiments, the first shielding element 114 an organic core material (e.g. ferromagnetic, high dielectric constant, etc.). A thickness and shape of the first shielding element 114 can be adjusted to provide adequate shielding (x-y) while minimizing parasitic coupling (x-y and/or z-axis spaces). By placing the first shielding element 114 directly on top of the electrical component 110 a required area for EM shielding on top of a set of electrical components 110 on a silicon wafer or other substrate 102 can be minimized.

The second shielding element 116 (e.g. metal, copper, or other conductive material) positioned above the electrical component 110, the passivation layer 108 and the first shielding element 114. In many example embodiments, the second shielding element 116 is positioned around all sides of (e.g. conformally plated around) the first shielding element 114 other than a side of the first shielding element 114 facing the passivation layer 108. In some example embodiments, the second shielding element 116 is electrically coupled to the reference plane 112 (e.g. ground plane) for EM shielding.

In this example 100 embodiment, the electrical component 110 is in contact with the first shielding element 114 as shown in FIG. 1.

Depending upon an application, one or both of the first shielding element 114 and/or the second shielding element 116 are opaque to a set of electromagnetic energy bands and are configured to block electromagnetic energy emanating either from the electrical component 110, an ambient environment, and/or other electrical components on the substrate 102.

In various example embodiments, care is taken so that the first shielding element 114 and/or second shielding element 116 are positioned at a required distance from the electrical component 110 so as to not interfere with the electrical component's 110 electromagnetic properties and/or operation.

Using both the first shielding element 114 and the second shielding element 116, performance specifications of the entire shielded device 100 and/or individual electrical components 110 can be maintained without a need for additional capacitive and/or inductive structures, or such structures can be smaller than they would otherwise need to be.

The metal layer 106 is positioned above the diffusion layer 104 and below the passivation layer 108 in this example 100. The metal layer 106 includes the reference plane 112 (e.g. ground plane).

The passivation layer 108 includes the set of vias 118. In this example embodiment 100, the vias 118 couple the reference plane 112 to the first shielding element 114; however in other example embodiments, the vias 118 can either couple the reference plane 112 just to the second shielding element 116, or couple both the first shielding element 114 and the second shielding element 116 to the reference plane 112. In some example embodiments, the vias 118 are arranged as a via-fence surrounding the electrical component 110. An optional ILD (Isolation Layer Dielectric) for minimizing lateral EM waves in the area may also be spin-coated on, instead of or in addition to the passivation layer 108, before the first shielding element 114 and the second shielding element 116 are added.

In some example embodiments an electrode of the electrical component 110 is also connected to the reference plane 112 (e.g. ground plane) and forms a part of the second 116 isolation shields.

The encapsulation layer 120 covers (e.g. hermetically seals) the first 114 and second shielding elements 116, the electrical component 110 and the substrate 102.

Figure 2:
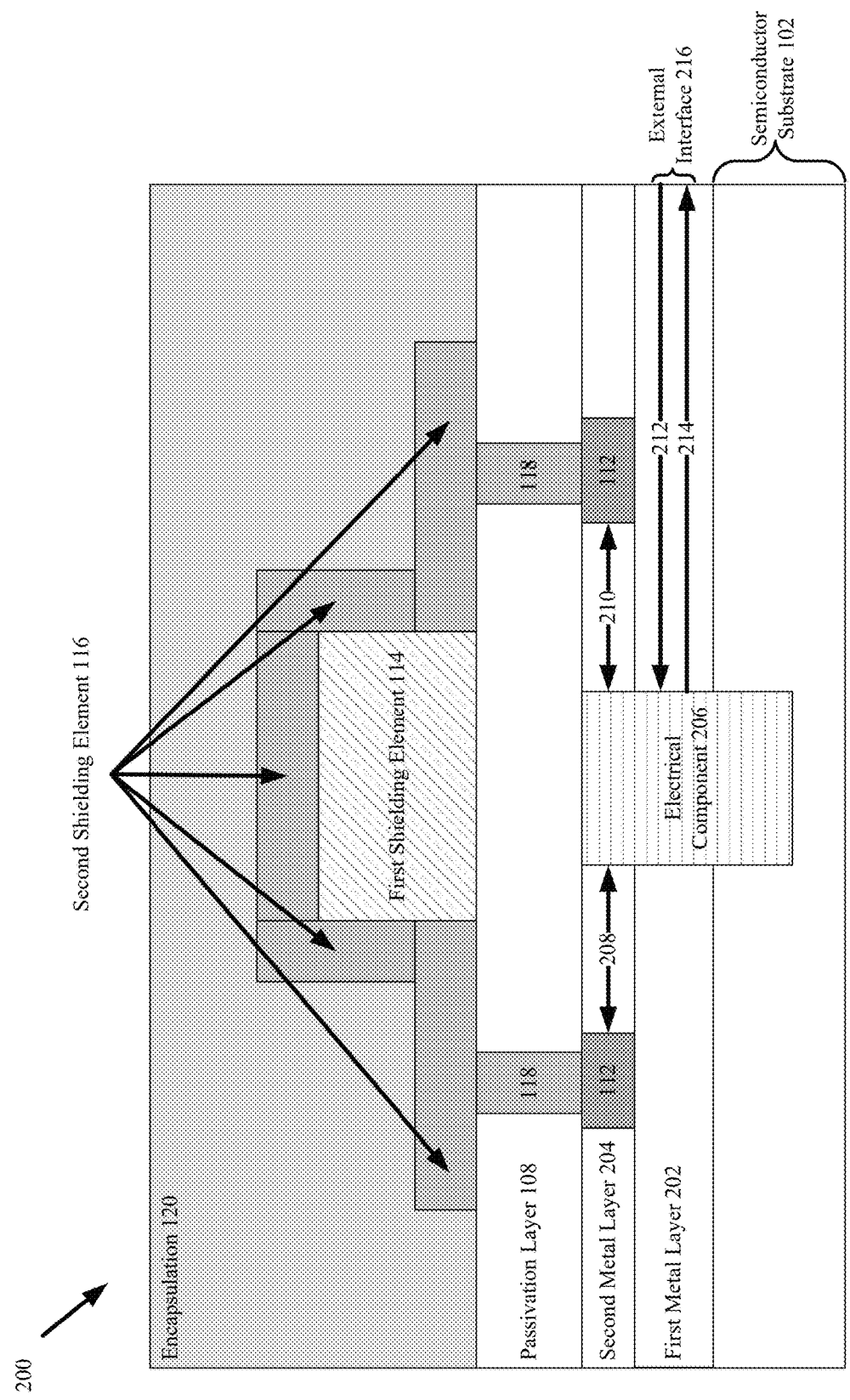
FIG. 2 represents a second example of the on-chip shielded device.

FIG. 2 represents a second example 200 of the shielded device. The second example shielded device 200 includes a substrate 102 (e.g. insulator, semiconductor, wafer, chip, etc.), a first metal layer 202, a second metal layer 204, a passivation layer 108 (e.g. SiO2), an electrical component 206 (e.g. active, passive, EM sensitive, etc.), a reference plane 112 (e.g. ground plane), a first metal wire 208, a second metal wire 210, a third metal wire 212 (signal input path), a fourth metal wire 214 (signal output path), an external interface 216, a first shielding element 114 (e.g. dielectric, organic material), a second shielding element 116 (e.g. metal plating), a set of vias 118, and an encapsulation 120 (e.g. molding compound).

In this example 200 embodiment, the electrical component 206 is not in contact with (i.e. is separated from) the first shielding element 114 as shown in FIG. 2. Instead, the electrical component is separated from the first shielding element 114 by the passivation layer 108.

In this example 200 embodiment, the electrical component 206 is also explicitly coupled to an input signal path (i.e. third metal wire 212) and an output signal path (i.e. fourth metal wire 214). The input signal path 212 and the output signal path 214 are configured to connect with a set of nodes outside of the first 114 and second 116 shielding element through the external interface 216.

The first metal layer 202 carries the third metal wire 212 (signal input path) and the fourth metal wire 214 (signal output path) so as to couple the electrical component 206 to other electrical devices either on-chip or off-chip through the external interface 216.

The second metal layer 204 is positioned above the first metal layer 202 and includes the reference plane 112 (e.g. ground plane) and the first metal wire 208 and the second metal wire 210 for coupling the electrical component 110 explicitly to the reference plane 112.

Otherwise, the second example shielded device 200 is similar to the first example shielded device 100.

Figure 3A:
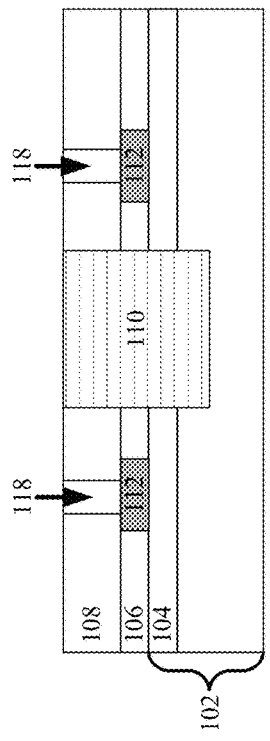
FIGS. 3A, 3B and 3C represents an example set of fabrication states for forming the first example on-chip shielded device.
Figure 3B:
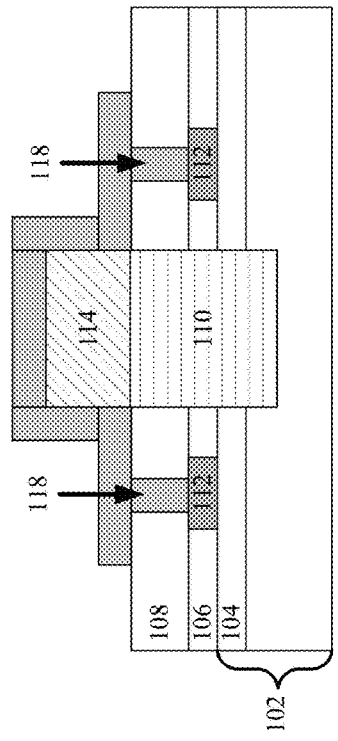
Figure 3C:
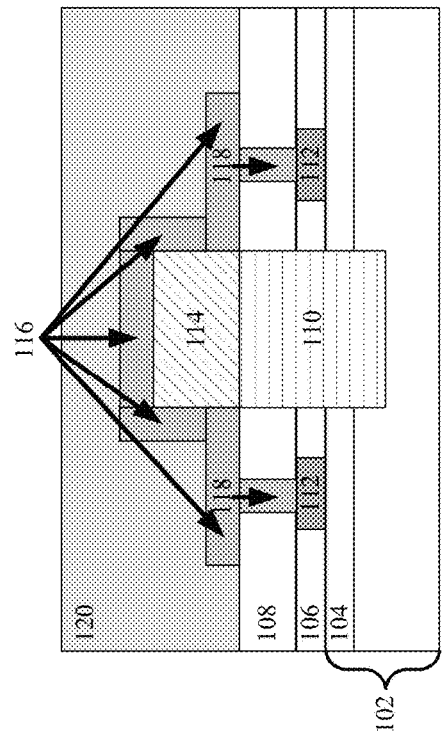

FIGS. 3A, 3B and 3C represents an example set of fabrication states 300 for forming the first example shielded device 100. The structures shown in FIG. 3A are fabricated using standard wafer fabrication techniques. As mentioned in FIG. 1, the optional ILD (Isolation Dielectric) layer for minimizing lateral EM waves in the area may additionally be spin-coated on the FIG. 3A structure before the first shielding element 114 and the second shielding element 116 are added as shown in FIG. 3B.

In FIG. 3B, the first shielding element 114 (e.g. dielectric, photoresist, organic material) can be locally deposited as a pattern over various electrical components (e.g. 110) as needed for EM isolation. As mentioned, the thickness and shape of the first shielding element 114 can be adjusted to provide adequate shielding (x-y or z-axis) while minimizing the parasitic coupling (x-y or z-axis) with the electrical component 110. The second shielding element 116 (e.g. metal plating) can be conformally plated over the first shielding element 114, the set of vias 118 and the passivation layer 108, as well as over select on-silicon ground pads.

In FIG. 3C, the structure is encapsulated using a conformal process.

Figure 4:
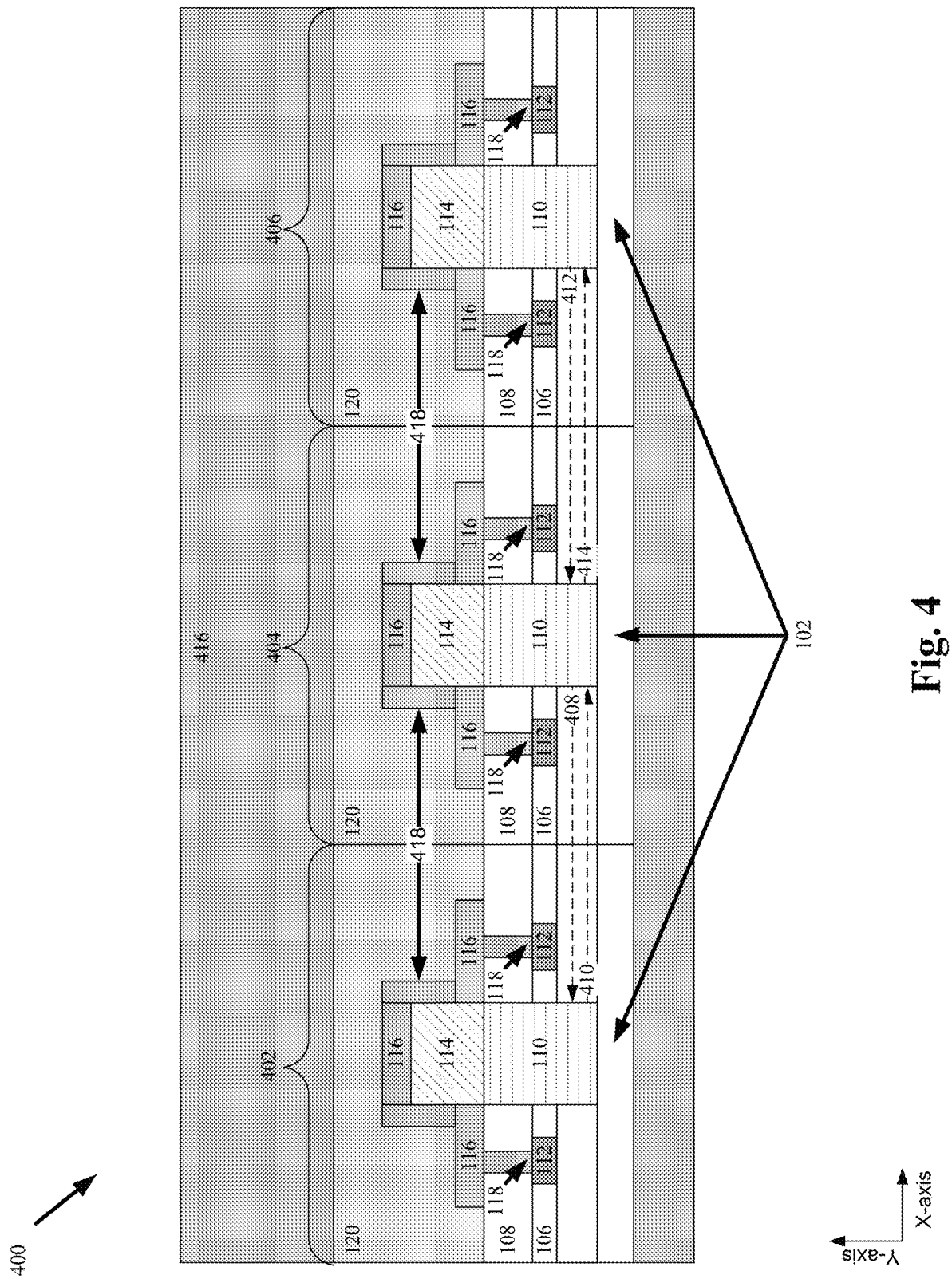
FIG. 4 represents an example set of on-chip shielded devices formed on a shared substrate.

FIG. 4 represents an example set of shielded devices 400 formed on the substrate 102. This example set of shielded devices 400 include a first shielded on-chip device 402, a second shielded on-chip device 404, and a third shielded on-chip device 406, all three 402, 404, 406 of which are similar to first example shielded on-chip device 100 and are all formed on the same substrate 102.

In example embodiments where the devices 402, 404, 406 are in electrical communication with each other a first set of signal paths 408, 410 electrically couples the first 402 and second 404 devices, and a second set of signal paths 412, 414 electrically couples the second 404 and the third 406 devices. Additionally the reference planes 112 (e.g. ground planes) may all be electrically coupled together for EM shielding.

All of the devices 402, 404, 406 are encapsulated in a same package 416. Each of the devices 402, 404, 406 include their own localized shielding structures (i.e. 114, 116) and are separated by a distance 418 which may or may not be a same distance depending upon a particular overall integrated circuit (IC) design.

Various fabrication steps discussed in the above Figures can be executed in any order, unless a specific order is explicitly stated. Also, those skilled in the art will recognize that while some example sets of fabrication steps have been discussed, the material in this specification can be combined in a variety of ways to yield other examples as well, and are to be understood within a context provided by this detailed description.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

What is claimed is:

1. An on-chip shielded device, comprising:
   a semiconductor material coupled to a passivation layer;
   an electrical component formed within the semiconductor material and coupled to an input signal path and an output signal path;
   a first shielding element positioned above the semiconductor material, the electrical component and the passivation layer; and
   a second shielding element positioned above the semiconductor material, the electrical component, the passivation layer and the first shielding element;

wherein the first shielding element and the second shielding element each have a lateral dimension that only covers the semiconductor material.

2. The on-chip shielded device of claim 1:
wherein the electrical component is in direct contact with the first shielding element.

3. The on-chip shielded device of claim 1:
wherein the electrical component is separated from the first shielding element by the passivation layer.

4. The on-chip shielded device of claim 1:
wherein the first shielding element is an organic core and/or photoresist-like material.

5. The on-chip shielded device of claim 1:
wherein the first shielding element is ferromagnetic, non-conductive, and/or has a high dielectric constant.

6. The on-chip shielded device of claim 1:
wherein the first shielding element is configured to provide electromagnetic shielding between the electrical component and a set of additional electrical components embedded within the semiconductor material.

7. The on-chip shielded device of claim 1:
wherein the second shielding element is a metal.

8. The on-chip shielded device of claim 7:
wherein the second shielding element is coupled to the semiconductor material and positioned around all sides of the first shielding element other than a side of the first shielding element facing the passivation layer.

9. The on-chip shielded device of claim 1:
wherein the first shielding element and the second shielding element are configured to block electromagnetic energy from reaching the electrical component.

10. The on-chip shielded device of claim 1:
further comprising a metallization layer positioned above a diffusion layer formed within the semiconductor material and below the passivation layer.

11. The on-chip shielded device of claim 10:
wherein the metallization layer includes a reference plane.

12. The on-chip shielded device of claim 11:
wherein the electrical component is coupled to the reference plane.

13. The on-chip shielded device of claim 11:
wherein the passivation layer includes a set of vias; and
wherein the set of vias couple the reference plane to the first shielding element.

14. The on-chip shielded device of claim 11:
wherein the passivation layer includes a set of vias; and
wherein the set of vias couple the reference plane to the second shielding element.

15. The on-chip shielded device of claim 11:
wherein the passivation layer includes a set of vias; and
wherein the vias couple the reference plane to either or both the first shielding element and the second shielding element; and
wherein the vias are arranged as a via-fence surrounding the electrical component.

16. The on-chip shielded device of claim 11:
wherein the passivation layer includes a set of vias;
wherein the set of vias couple both the first shielding element and the second shielding element to the reference plane; and
wherein the electrical component is coupled to the reference plane.

17. The on-chip shielded device of claim 1:
further comprising an encapsulation layer; and
wherein the encapsulation layer covers the first and second shielding elements.

18. The on-chip shielded device of claim 1:
wherein the electrical component is a first electrical component formed within the semiconductor material;
further comprising a second electrical component, also formed within the semiconductor material and a diffusion layer; and
wherein the first and second electrical components are separated by a distance within the semiconductor material.

19. The on-chip shielded device of claim 18:
further comprising,
a third shielding element coupled to the semiconductor material and positioned above the second electrical component; and
a fourth shielding element coupled to the semiconductor material and positioned above the second electrical component and the third shielding element;
wherein the first and second shielding elements are separated from the third and fourth shielding elements by the distance.

20. The on-chip shielded device of claim 19:
further comprising an encapsulation layer; and
wherein the encapsulation layer covers the first, second, third and fourth shielding elements.

21. The on-chip shielded device of claim 1:
wherein the input signal path and the output signal path are configured to connect with a set of nodes outside of the first and second shielding elements.

22. The on-chip shielded device of claim 1:
wherein the electrical component is at least one of: a monolithic microwave integrated circuits (MMICs), a waveguide, an RF device, an RF tuner, an RF amplifier, an RF detector, or an RF antenna.

23. The on-chip shielded device of claim 1:
wherein the first shielding element and the second shielding element are coupled to the semiconductor material.

24. An on-chip shielded device, comprising:
a planar structure including a semiconductor substrate and a passivation layer;
an electrical component formed within the semiconductor substrate and coupled to an input signal path and an output signal path;
a first shielding element positioned above the electrical component and the passivation layer; and
a second shielding element positioned above the electrical component, the passivation layer and the first shielding element;
a metallization layer positioned above a diffusion layer and below the passivation layer;
wherein the metallization layer includes a reference plane;
wherein the passivation layer includes a set of vias;
wherein the set of vias couple the reference plane to the second shielding element; and
wherein the first shielding element and the second shielding element each have a lateral dimension that only covers the semiconductor substrate.

* * * * *